United States Patent [19]
Park

[11] Patent Number: 6,040,593
[45] Date of Patent: Mar. 21, 2000

[54] IMAGE SENSOR HAVING SELF-ALIGNED SILICIDE LAYER

[75] Inventor: Sang Hoon Park, Ichon, Rep. of Korea

[73] Assignee: Hyundai Electronics Industries Co., Ltd., Kyoungki-do, Rep. of Korea

[21] Appl. No.: 09/342,486

[22] Filed: Jun. 29, 1999

[30] Foreign Application Priority Data

Jun. 29, 1998 [KR] Rep. of Korea ............. 98-24648

[51] Int. Cl.[7] ................................................ H01L 27/108
[52] U.S. Cl. ..................... 257/292; 257/291; 257/233; 257/382; 257/384
[58] Field of Search ................................ 257/233, 291, 257/292, 458, 495, 382, 383, 384

[56] References Cited

U.S. PATENT DOCUMENTS 5,841,159  11/1998  Lee et al. ............................ 257/291
5,880,495  3/1999  Chen ................................... 257/292

*Primary Examiner*—Minh Loan Tran
*Attorney, Agent, or Firm*—Townsend and Townsend and Crew LLP

[57] ABSTRACT

The present invention is to provide a CMOS image sensor, including a photo-sensing region, in which a buried photodiode is formed, for sensing light from an object; a plurality of transistors electrically coupled to the buried photodiode; silicide layers formed on gates and heavily doped regions except the photo-sensing region; and a plurality of insulating layer patterns which are provided by patterning an insulating layer, wherein the insulating layer patterns include: insulating spacers formed on sidewalls of the gates, which are respectively provided for the plurality of transistors; and a passivation layer formed on the photo-sensing region and on a sidewall of neighboring one of the gates.

5 Claims, 6 Drawing Sheets

IMAGE SENSOR HAVING SELF-ALIGNED SILICIDE LAYER

FIELD OF THE INVENTION

The present invention relates to an image sensor; and, more particularly, to a CMOS (Complementary Metal Oxide Semiconductor) image sensor having a self-aligned silicide layer.

DESCRIPTION OF THE PRIOR ART

Generally, a CMOS image sensor is an apparatus to convert an optical image into an electrical signal and employs MOS (Metal Oxide Semiconductor) transistors. A CCD (Charge Coupled Device) image sensor, as a kind of image sensor, has been widely known. As compared with the CCD image sensor, the CMOS image sensor may be easily driven with implement various scanning schemes and integrated with a signal processing circuit on one-chip. Therefore, the CMOS image sensor may miniaturize its size and reduce the fabricating cost by using a compatible CMOS technology and lower the power consumption.

Referring to FIG. 1, a conventional unit pixel of a CMOS image sensor is composed of a buried photodiode (BPD) and four NMOS transistors. The four NMOS transistors include a transfer transistor 102 for transferring photoelectric charges generated in a buried photodiode to a sensing node, a reset transistor 104 for resetting the sensing node in order to sense a next signal, a drive transistor 106 for acting as a source follower and a select transistor 108 for outputting data to an output terminal in response to an address signal.

The reset transistor 104 and the transfer transistor 102 are made up of a native NMOS transistor so that the charge transfer efficiency is improved. The native NMOS transistor having a negative threshold voltage can prevent electron losses from being generated by a voltage drop due to a positive threshold voltage and then contribute the charge transfer efficiency to be improved.

Referring to FIG. 2, the conventional unit pixel of the CMOS image sensor includes a $P^+$ silicon substrate 201, a P-epi (epitaxial) layer 202, a P-well region 203, field oxide layers 204, a gate oxide layer 205, gate electrodes 206, an $N^-$ diffusion region 207, a $P^0$ diffusion region 208, $N^+$ diffusion regions 209 and oxide layer spacers 210. A buried photodiode (BPD) has a PNP junction structure in which the P-epi layer 202, the $N^-$ diffusion region 207 and the $P^0$ diffusion region 208 are stacked.

Since the transfer transistor having the transfer gate Tx is made up of a native transistor, an ion implantation process for adjusting transistor characteristics (threshold voltage and punch-through characteristics) may be omitted in the p-epi layer 211 which acts as a channel beneath a transfer gate Tx. Accordingly, the NMOS transistor (native transistor) having a negative threshold voltage maymaximize the charge transfer efficiency. The $N^+$ diffusion region 209 (the sensing node) is made up of a highly doped $N^+$ region between the transfer gate Tx and the reset gate Rx, thereby amplifying a potential of the sensing node according to an amount of transferred charges.

This conventional CMOS image sensor senses electrical signals corresponding to photoelectric charges through a CDS (Correlated Double Sampling). A silicide layer is used to form a polycide gate structure in the conventional CMOS image sensor. However, the polycide gate structure may not obtain the desired operation speed in the conventional CMOS image sensor because the silicide layer is formed on each transistor gate but it is not formed on the junction region (the $N^+$ diffusion region). Also, if a self-aligned silicide process is applied to the conventional CMOS image sensor, there is a problem that the silicide layer is formed on the $P_0$ diffusion region of the buried photodiode, thereby intercepting a photo-sensing function.

Accordingly, it is necessary for the CMOS image sensor to form the silicide layer on each transistor gate and the junction region except on the $P^0$ diffusion region of the buried photodiode so that the desired operation speed may be obtained.

SUMMARY OF THE INVENTION

It is, therefore, an object of the present invention to provide a high-speed CMOS image sensor.

It is, another object of the present invention to provide a high-speed CMOS image sensor using a self-aligned silicide process.

In accordance with an aspect of the present invention, there is provided a CMOS (Complementary Metal Oxide Semiconductor) image sensor, comprising: a photo-sensing region, in which a buried photodiode is formed, for sensing light from an object; a plurality of transistors electrically coupled to the buried photodiode; silicide layers formed on gates and heavily doped regions except the photo-sensing region; and a plurality of insulating layer patterns which are provided by patterning an insulating layer, wherein the insulating layer patterns include: insulating spacers formed on sidewalls of the gates, which are respectively provided for the plurality of transistors; and a passivation layer formed on the photo-sensing region and on a sidewall of neighboring one of the gates.

In accordance with another aspect of the present invention, there is provided a unit pixel in a CMOS (Complementary Metal Oxide Semiconductor) image sensor, comprising: a semiconductor layer of a first conductive type; a buried photodiode formed in the semiconductor layer, for sensing light from an object and generating photoelectric charges; a floating junction of a second conductive type formed in the semiconductor layer, for receiving and storing the photoelectric charges from the buried photodiode; a transfer gate formed on the semiconductor layer between the floating junction and the buried photodiode; a drain junction of the second conductive type formed in the semiconductor layer; a reset gate formed on the semiconductor layer between the floating junction and the drain junction; a well region of the first conductive type formed in the semiconductor layer; drive and select gates formed on the well region with source/drain junctions; silicide layers formed on the floating junction, the transfer gate, the drain junction, the reset gate, the select gate and the source/drain junctions of the drive and select gates; and a plurality of insulating layer patterns which are provided by patterning an insulating layer, wherein the insulating layer patterns include; insulating spacers formed on sidewalls of the transfer, reset, drive and select gates; and a passivation layer formed on the photo-sensing region and on a sidewall of the transfer gate.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereafter, the present invention will be described in detail with reference to the accompanying drawings.

Figure 1:
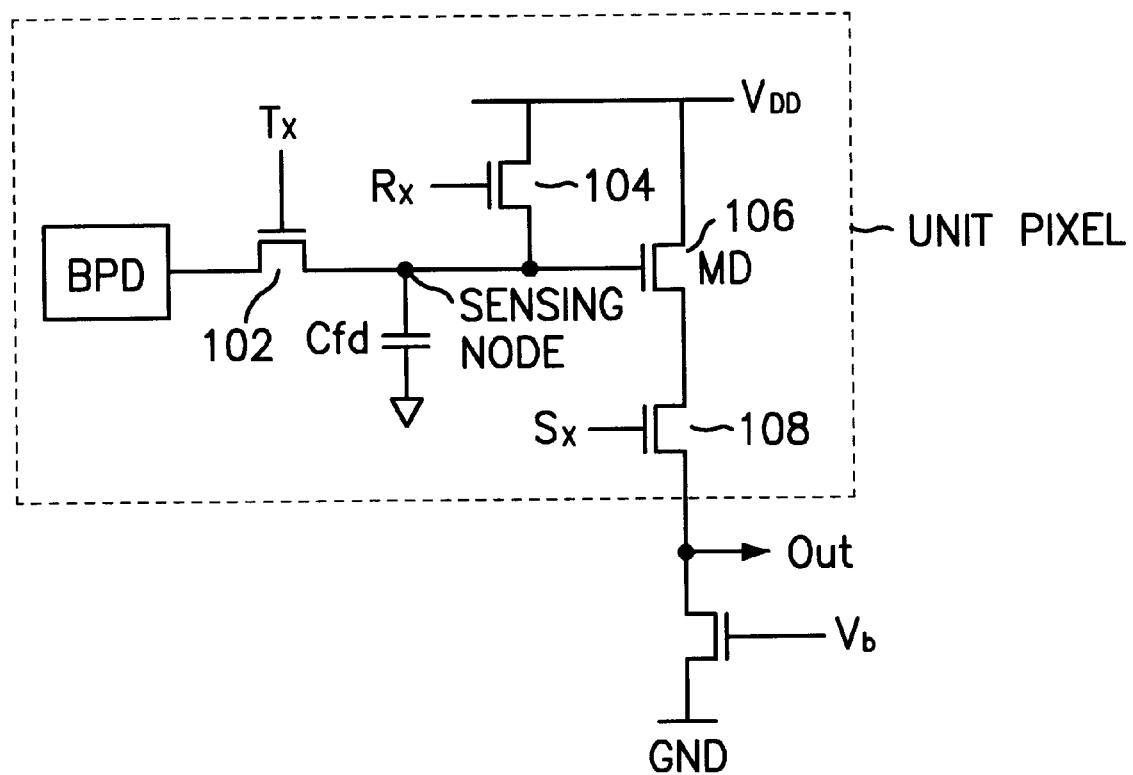
FIG. 1 is a circuit diagram illustrating a unit pixel of a conventional CMOS image sensor.
Figure 2:
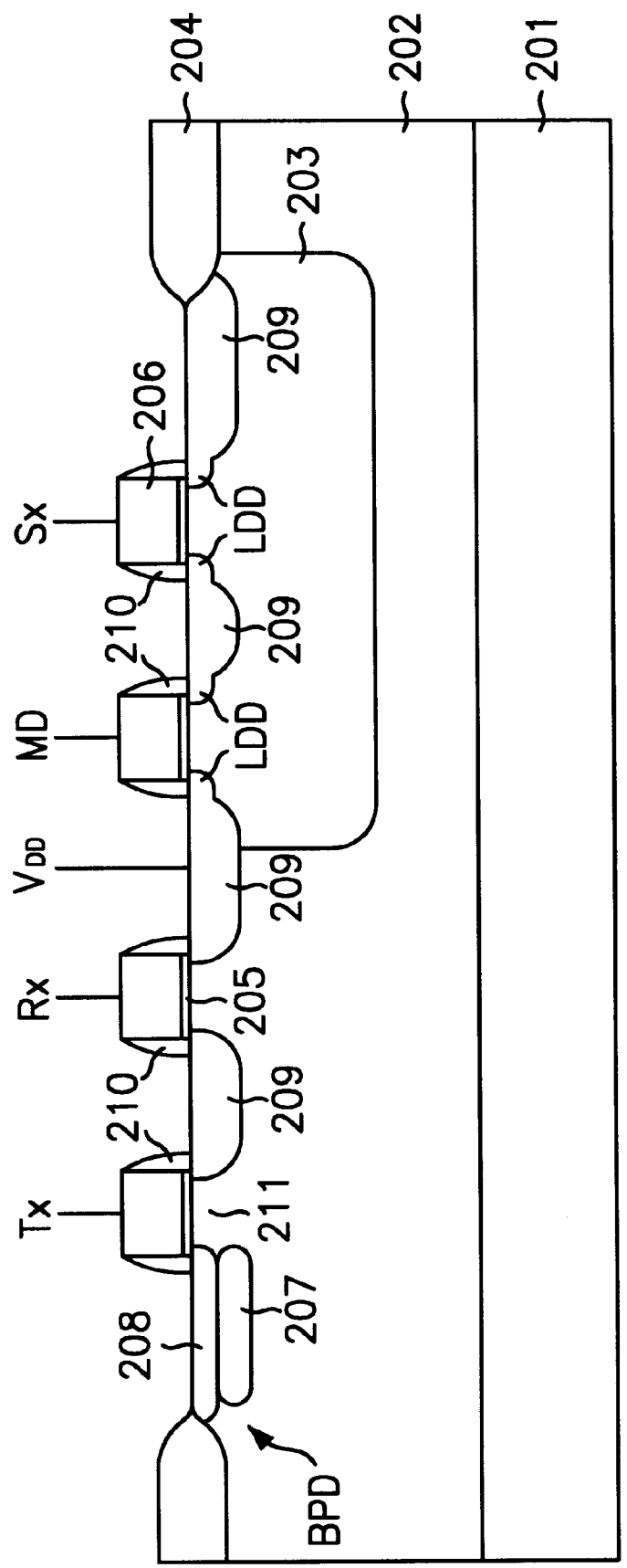
FIG. 2 is a cross-sectional view illustrating a structure of the unit pixel in FIG. 1.
Figure 3:
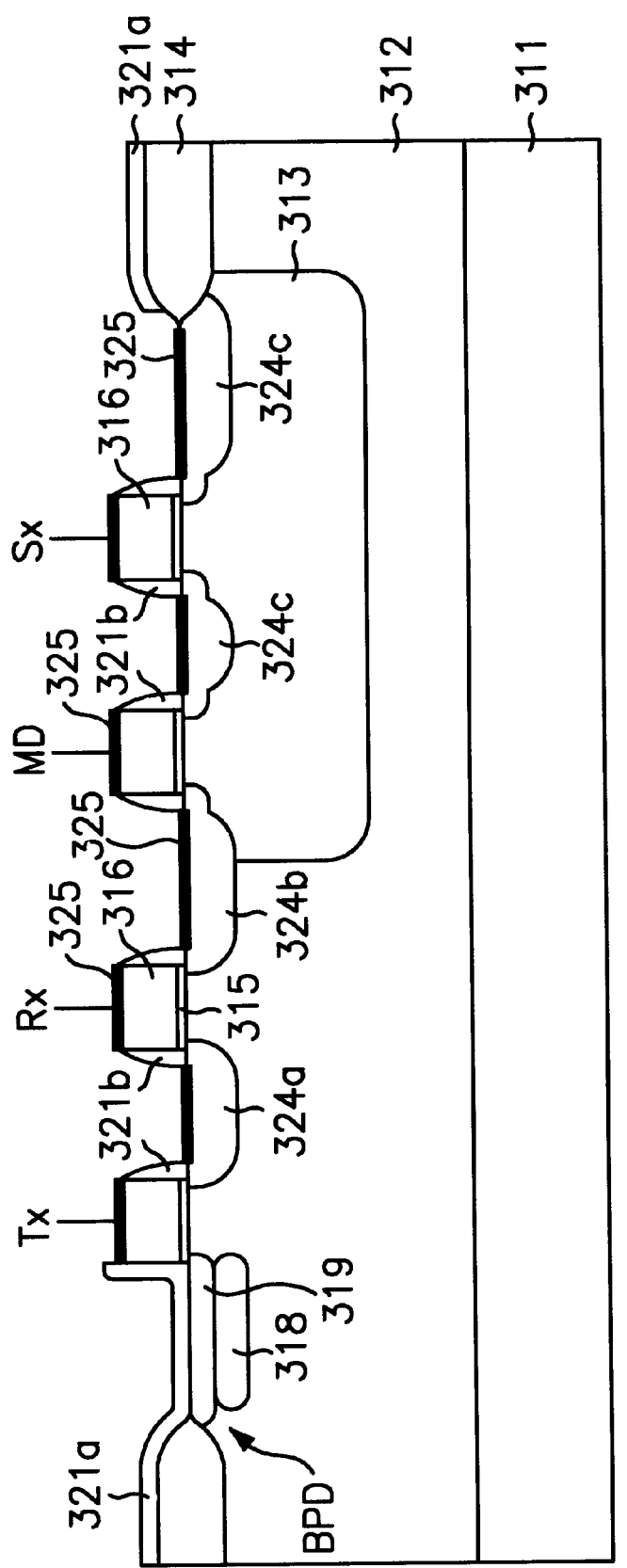
FIG. 3 is a cross-sectional view illustrating a unit pixel of a CMOS image sensor according to an embodiment of the present invention.

Referring to FIG. 3, a P-epi (epitaxial) layer 312 is grown on a silicon substrate 311 and the buried photodiode is formed within the P-epi layer 312 in order to sense light from an object and generate photoelectric charges. An $N^+$ floating junction 324a is formed in the P-epi layer 312 in order to receive and store the photoelectric charges from the buried photodiode.

A transfer gate Tx is formed on the P-epi layer 312 between the $N^+$ floating junction 324a and the buried photodiode, and an $N^+$ drain junction 324b is formed in the P-epi layer 312 between a reset gate Rx and a drive gate MD. The reset gate Rx is formed on the P-epi layer 312 between the $N^+$ floating junction 324a and the N drain junction 324b. Source/drain $N^+$ diffusion regions 324c are formed in a P-well 313, and the drive transistor has the drive gate MD coupled electrically to the $N^+$ floating junction 324a. A select transistor has the source/drain $N^+$ diffusion regions 324c formed in the P-well 313.

The silicide layers 325 are formed on the transfer gate Tx, the reset gate Rx, the select gate Sx, the drive gate MD, the $N^+$ floating junction 324a, the $N^+$ drain junction 324b and the source/drain $N^+$ diffusion regions 324c.

The silicide layer 325 is not formed on the buried photodiode, and a TEOS (Tetraethoxysilane) oxide layer pattern 321a as a passivation layer is formed on the buried photodiode instead of the silicide layer. The patterned passivation layer is the same material as a spacer 321b on sidewalls of the transfer, reset, drive and select gates Tx, Rx, MD and Sx.

FIGS. 4A to 4F are cross-sectional views illustrating the unit pixel in FIG. 3.

As shown in FIGS. 4A to 4F, a self-aligned silicide process forms the silicide layer on each transistor gate and junction regions such that the operation speed of the CMOS image sensor is improved.

Figure 4A:
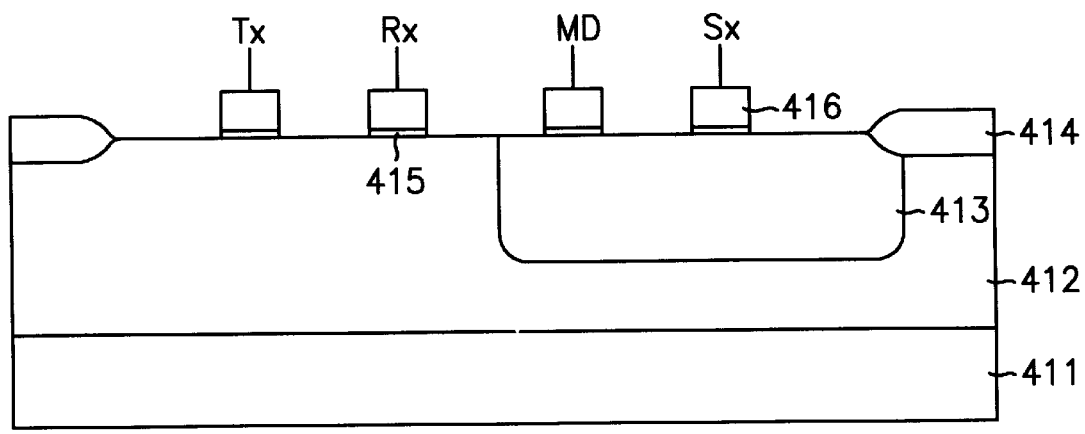
FIGS. 4A to 4F are cross-sectional views illustrating the unit pixel in FIG. 3.

Referring to FIG. 4A, on conditions of energy of approximately 50–100 KeV and a concentration of 7E12–9E12/$cm^2$, a P-well 413 is formed in a P-epi layer 412 by a boron ion implantation and the P-epi layer 412 is grown on a silicon substrate 411 as an epitaxial layer. The P-epi layer 412 has a resistance of approximately 10–1000 Ωm. Then, field oxide layers 414, gate oxide layers 415 and gate electrodes 416 are in this order formed.

The gate electrodes 416 are made up of doped polysilicon layers. A transfer gate Tx and a reset gate Rx among the gate electrodes 416 are patterned so that they have channel length more than approximately 1 μm. Also, a drive gate MD and a select gate Sx are patterned so that they have channel length less than approximately 0.5 μm. The reason why the channel length of the transfer and reset gates Tx and Rx is larger than that of the drive and select gates MD and Sx is to improve punch-through voltage characteristics of the transfer and reset gates Tx and Rx, i.e., to improve a photosensitivity by increasing a voltage swing of 0 V to a predetermined pinning voltage. Typically, the predetermined pinning voltage is approximately 2.5 V in the case of operating voltage of 3.3 V.

Figure 4B:
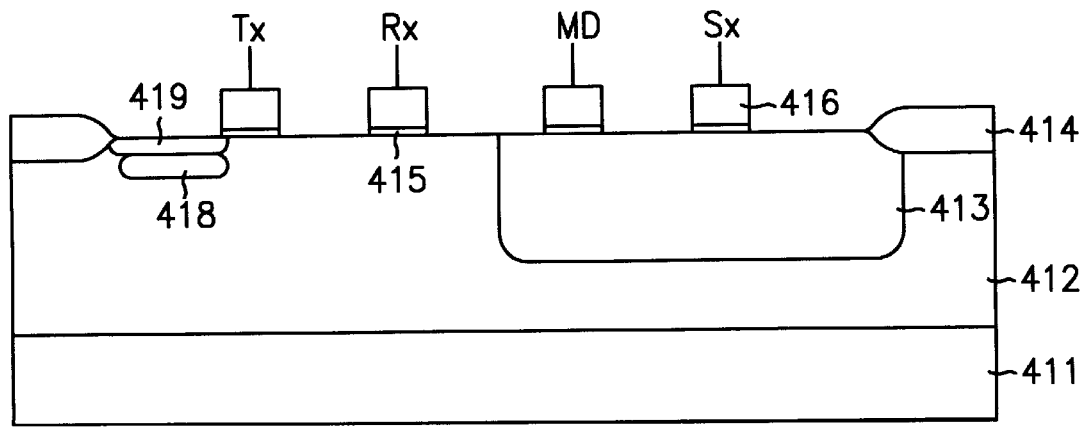

Referring to FIG. 4B, the buried photodiode is formed by mask and ion implantation processes. That is, on conditions of energy of approximately 150–200 KeV and a concentration of 1E12–3E12/$cm^2$, an $N^-$ diffusion region 418 is formed by a phosphor ion implantation. Also, on conditions of energy of approximately 20–40 KeV and a concentration of 1E13–3E13/$cm^2$, a $P^0$ diffusion region 419 is formed by a $BF_2$ ion implantation.

Figure 4C:
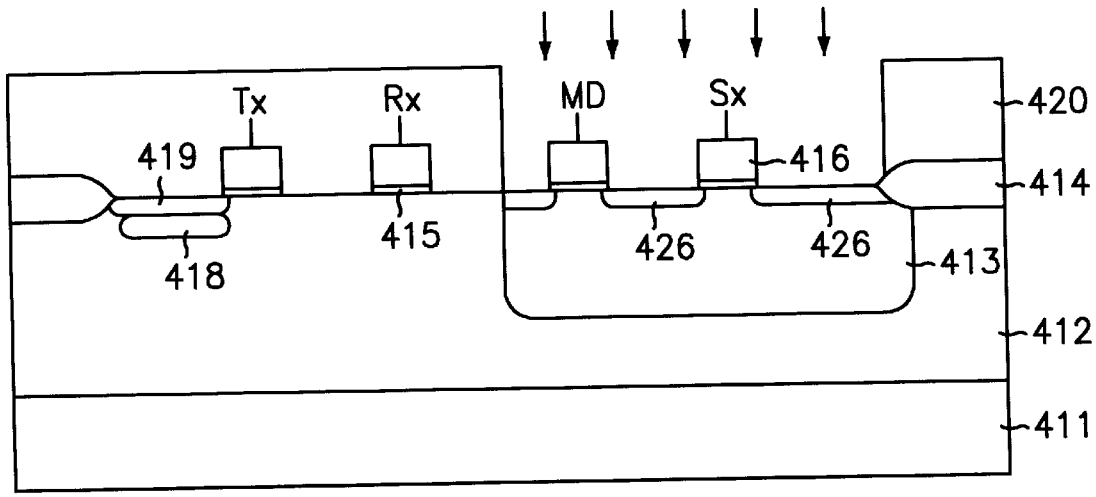

Referring to FIG. 4C, a mask 420 to open the P-well 413 is formed. Then, on conditions of energy of approximately 20–60 KeV and a concentration of 1E13–5E13/$cm^2$, lightly doped $N^-$ regions 426 for a LDD (lightly doped drain) structure are formed by a phosphor ion implantation between the drive and select gates MD and Sx.

Figure 4D:
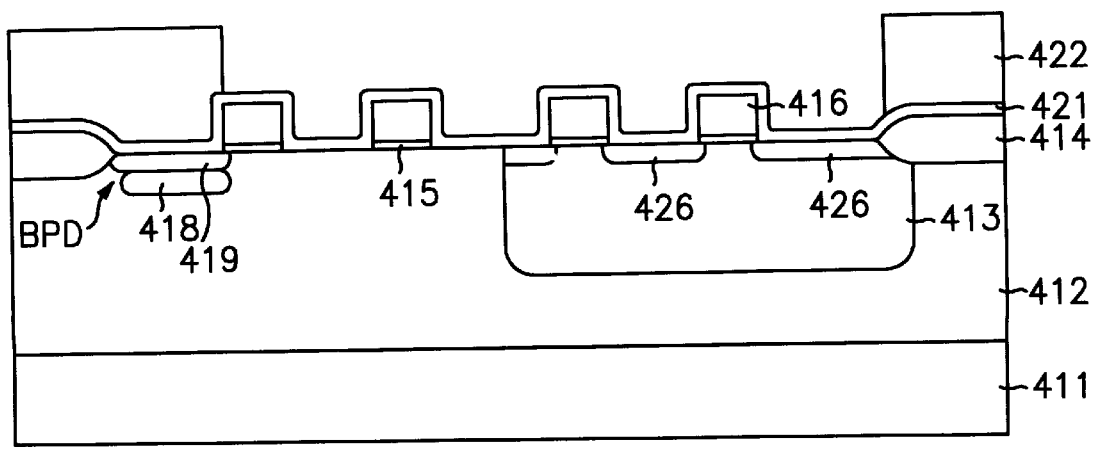

Referring to FIG. 4D, after removing the mask 420, a TEOS (Tetraethoxysilane) layer 421 of approximately 2,000–2,500 Å is formed on the resulting structure by the LPCVD (Low Pressure Chemical Vapor Deposition) process and a mask is patterned. At this time, an edge of the opened portion of the mask 422 is aligned with an edge of the transfer gate Tx adjacent to the buried photodiode. Although an alignment error within approximately 0.1 μm can occur at the time of forming the mask 422, the buried photodiode is not exposed at the time of a subsequent etching process which is an anisotropical plasma etching process to the TEOS layer 421. The reason is that a thickness of the TEOS layer 421 is approximately 0.2–0.25 μm and the TEOS layer 421 formed on the sidewall of the gate electrode 416 of the transfer gate Tx may cover the alignment error of 0.1 μm.

Figure 4E:
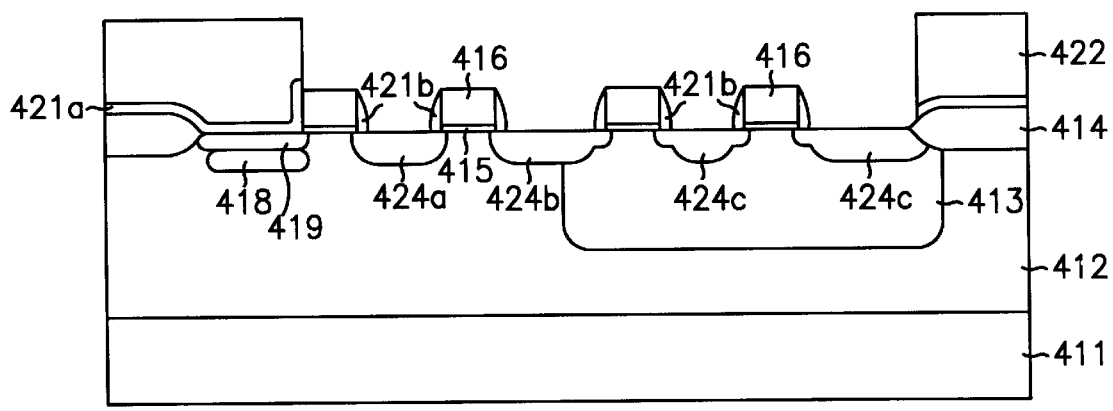

Referring to FIG. 4E, by applying an anisotropical plasma etching process to the TEOS layer 421, spacers 421b are formed on the sidewalls of the gate electrodes 416 except one sidewall of the transfer gate Tx. Then, a pattern 421a of the TEOS layer 421 are formed, covering the buried photodiode and the field oxide layers 414. Such a pattern 421a acts as the passivation layer such that silicide is not formed on the buried photodiode.

On conditions of energy of approximately 60–90 KeV and a concentration of 1E15–9E15/$cm^2$, an $N^+$ floating junction 424a, an $N^+$ drain junction 424b and $N^+$ diffusion regions 424c for source/drain regions of the drive and select transistors are formed by an As ion implantation.

Figure 4F:
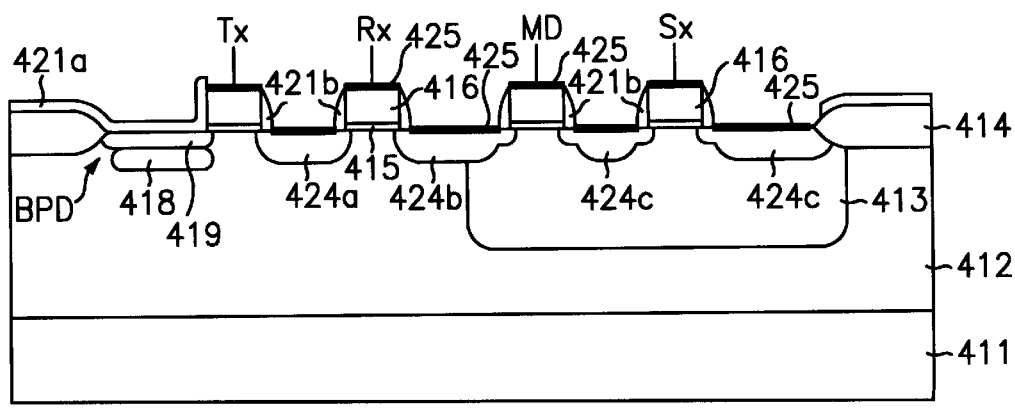

Referring to FIG. 4F, the mask 422 is removed and then titanium silicide layers ($TiSi_2$) 425 are formed on the exposed gate electrodes 416 and the $N^+$ diffusion regions 424a, 424b and 424c. That is, after removing the mask 422, a titanium layer of approximately 300–500 Å is deposited on the resulting structure and a first rapid thermal treatment is applied to the deposited titanium layer at a temperature of approximately 700–750° C. Then, each silicon component of the polysilicon gate electrode and the $N^+$ diffusion regions 424a, 424b and 424c reacts on the titanium layer such that the titanium silicide layers 425 are formed. The titanium (Ti) layers, which are not reacted with the TEOS layers 421a and 421b, are removed by a chemical solution containing $NH_4OH$. Also, the titanium silicide layers 425, which are formed on the exposed gate electrodes 416 and the $N^+$ diffusion regions 424a, 424b and 424c, undergo a second rapid thermal treatment of approximately 820–870° C. As well known to those skilled in the act, the titanium layer can be replaced with other refractory metal layers, such as titanium silicide. As apparent from the above, since the present invention forms the silicide layer on the gate electrodes and heavily doped regions without a damage of the buried photodiode, high speed transistors are implemented, insuring fast image data processing.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CMOS (Complementary Metal Oxide Semiconductor) image sensor, comprising:
    a photo-sensing region, in which a buried photodiode is formed, for sensing light from an object;
    a plurality of transistors electrically coupled to the buried photodiode;
    silicide layers formed on gates and heavily doped regions of said pluralit of transistors except the photo-sensing region; and
    a plurality of insulating layer patterns which are provided by patterning an insulating layer, wherein the insulating layer patterns include:
        insulating spacers formed on sidewalls of the gates, which are respectively provided for the plurality of transistors; and
        a passivation layer formed on the photo-sensing region and on a sidewall of neighboring one of the gates.

2. The CMOS image sensor as recited in claim 1, wherein the insulating layer is a TEOS (Tetraethoxysilane) layer.

3. A unit pixel in a CMOS (Complementary Metal Oxide Semiconductor) image sensor, comprising:
    a semiconductor layer of a first conductive type;
    a buried photodiode having a photo-sensing region formed in the semiconductor layer, for sensing light from an object and generating photoelectric charges;
    a floating junction of a second conductive type formed in the semiconductor layer, for receiving and storing the photoelectric charges from the buried photodiode;
    a transfer gate formed on the semiconductor layer between the floating junction and the buried photodiode;
    a drain junction of the second conductive type formed in the semiconductor layer;
    a reset gate formed on the semiconductor layer between the floating junction and the drain junction;
    a well region of the first conductive type formed in the semiconductor layer;
    drive and select gates formed on the well region with source/drain junctions;
    silicide layers formed on the floating junction, the transfer gate, the drain junction, the reset gate, the select gate and the source/drain junctions of the drive and select gates; and
    a plurality of insulating layer patterns which are provided by patterning an insulating layer, wherein the insulating layer patterns include;
        insulating spacers formed on sidewalls of the transfer, reset, drive and select gates; and
        a passivation layer formed on the photo-sensing region and on a sidewall of the transfer gate.

4. The unit pixel as recited in claim 3, wherein the transfer and reset gates have channel length more than approximately 1 $\mu$m and the drive and select gates have channel length less than approximately 0.5 $\mu$m.

5. The unit pixel as recited in claim 3, wherein the insulating layer is a TEOS (Tetraethoxysilane) layer.

* * * * *